United States Patent
Teboulle et al.

(10) Patent No.: US 12,163,994 B2
(45) Date of Patent: Dec. 10, 2024

(54) DETECTING FAULTY CLAMPING

(71) Applicant: SAGEMCOM ENERGY & TELECOM SAS, Rueil Malmaison (FR)

(72) Inventors: Henri Teboulle, Rueil Malmaison (FR); Philippe Engel, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 158 days.

(21) Appl. No.: 17/953,929

(22) Filed: Sep. 27, 2022

(65) Prior Publication Data
US 2023/0098108 A1 Mar. 30, 2023

(30) Foreign Application Priority Data
Sep. 28, 2021 (FR) ...................................... 2110196

(51) Int. Cl.
*G01R 31/12* (2020.01)
*G06Q 50/06* (2012.01)

(52) U.S. Cl.
CPC ......... *G01R 31/1272* (2013.01); *G06Q 50/06* (2013.01)

(58) Field of Classification Search
CPC .... G01R 31/12; G01R 31/1272; G01R 22/06; G01R 22/068; G01R 22/066; G01R 35/04; G01R 31/58; G01R 31/69; G01R 19/25; G01R 19/2513; G01R 11/25; G06Q 50/06
See application file for complete search history.

(56) References Cited

U.S. PATENT DOCUMENTS

| | | | | |
|---|---|---|---|---|
| 2015/0377949 A1* | 12/2015 | Ramirez | .............. | G01R 22/068 324/105 |
| 2019/0154786 A1* | 5/2019 | Teboulle | ................ | G01R 35/04 |
| 2021/0098985 A1* | 4/2021 | Kim | .......................... | H02J 3/00 |

FOREIGN PATENT DOCUMENTS

| | | | | |
|---|---|---|---|---|
| EP | 0430823 A1 | 6/1991 | | |
| EP | 2435842 B1 * | 6/2019 | ............. | G01R 19/15 |
| WO | WO-2015179908 A1 * | 12/2015 | ........... | G01R 31/086 |

* cited by examiner

*Primary Examiner* — Son T Le
(74) *Attorney, Agent, or Firm* — MUNCY, GEISSLER, OLDS & LOWE, P.C.

(57) ABSTRACT

An electricity meter includes at least one input terminal, at least one voltage sensor, and at least one current sensor, and a processor unit arranged to acquire the voltage measurements and the current measurements, and to detect a first period during which the source current is less than a first predefined current threshold, and a second period during which the source current is greater than a second predefined current threshold, to acquire a first voltage measurement during the first period and a second voltage measurement during the second period, and to detect faulty clamping between at least one wire and the input terminal when at least one detection value representative of a difference between a first voltage measurement and a second voltage measurement is greater than or equal to a voltage threshold.

15 Claims, 3 Drawing Sheets

DETECTING FAULTY CLAMPING

The invention relates to the field of electricity meters.

BACKGROUND OF THE INVENTION

When installing an electricity meter in the premises of a subscriber (whether private or industrial), it can happen that an installer clamps poorly one or more electricity delivery wires (phase wire(s) or neutral wire). Poor clamping can give rise to a problem a long time after installation.

Specifically, faulty clamping of a wire to an input terminal of the meter can lead to heating, which in turn might give rise to a fire in the meter.

Proposals have thus naturally been made to detect faulty clamping and to alert the installer and/or the manager of the network by incorporating a temperature sensor inside the meter in order to measure temperature in the proximity of the input terminals. Nevertheless, that solution is not completely satisfactory.

Specifically, that solution requires at least one new sensor together with its associated measuring components to be incorporated, such that it is relatively complicated and expensive to implement.

Furthermore, although an abnormal temperature rise as detected by the temperature sensor in the meter might be caused by faulty clamping, it could also have some other origin, e.g. heating of a cut-off member connected to a phase line inside the meter. There is no difference between heating due to the cut-off member and heating due to a poorly clamped wire, which means that the precise origin of the heating cannot be detected. In addition, that solution therefore does not make it possible to determine which input terminal is poorly clamped.

OBJECT OF THE INVENTION

An object of the invention is to make it possible to detect poor clamping of a cable in an input terminal of a meter, with such detection being quick, simple, inexpensive to perform, and leaving no doubt as to the origin of the fault.

SUMMARY OF THE INVENTION

In order to achieve this object, there is provided an electricity meter, arranged to measure electrical energy supplied by a source, the meter comprising:
at least one input terminal, each input terminal being arranged to be connected to the source by a respective wire;
at least one voltage sensor and at least one current sensor arranged to act from inside the electricity meter to take voltage measurements to evaluate a source voltage supplied by the source, and current measurements for evaluating a source current supplied by the source;
a processor unit arranged:
to acquire the voltage measurements and the current measurements, and to detect at least one predefined sequence comprising a first period during which the source current is less than a first predefined current threshold, and a second period during which the source current is greater than a second predefined current threshold that is itself greater than the first predefined current threshold;
for each predefined sequence, to acquire at least one first voltage measurement during the first period and at least one second voltage measurement during the second period;
to detect faulty clamping between at least one wire and the input terminal that is connected to said wire when, during at least one predefined sequence, at least one detection value representative of a difference between a first voltage measurement and a second voltage measurement is greater than or equal to a voltage threshold.

The electricity meter of the invention does not require additional hardware components in order to detect faulty clamping, such that the invention is both simple and inexpensive to implement.

The detection criterion is based on how the measured source voltage (upstream from the input terminal) varies when the source current goes from a low level to a high level, or vice versa. This variation depends on the impedance of the input terminal, which in turn depends on the quality with which the wire is clamped. There can thus be no dispute concerning the origin of the observed fault. Faulty clamping the can be detected immediately after a predetermined sequence, and thus very quickly.

There is also provided an electricity meter as described above, wherein the processor unit is arranged to detect a predefined sequence only when the duration between the first period and the second period is less than a predefined time threshold.

There is also provided an electricity meter as described above, wherein the voltage threshold is defined as a function both of a first current measurement taken during the first period and also of a second current measurement taken during the second period.

There is also provided an electricity meter as described above, wherein the following applies:

$$SV=a*(I2-I1);$$

where SV is the voltage threshold, a is a parameter, I1 is the first current measurement taken during the first period, and I2 is the second current measurement taken during the second period.

There is also provided an electricity meter as described above, wherein the parameter a is defined as a function both of the first predefined current threshold and also of the second predefined current threshold.

There is also provided an electricity meter as described above, wherein the processor unit is arranged to act over a single predefined sequence to obtain a plurality of detection values, and to detect faulty clamping when the number of those detection values that are greater than the voltage threshold reaches a first predefined number.

There is also provided an electricity meter as described above, wherein the processor unit is arranged to act over a plurality of successive predefined sequences to obtain detection values, the number of successive sequences being a second predefined number, and to detect faulty clamping when a plurality of those detection values are greater than the voltage threshold.

There is also provided an electricity meter as described above, wherein the first predefined current threshold lies in the range 2.5 amps (A) to 7.5 A, and the second predefined current threshold lies in the range 20 A to 60 A.

There is also provided an electricity meter as described above, the source having three phase lines, the electricity meter being a three-phase meter including three input terminals, each arranged to be connected to a respective phase line via a respective phase wire, the electricity meter including, for each phase wire, both a respective voltage sensor arranged to produce voltage measurements for evaluating the source voltage present on said phase wire and also a current sensor arranged to produce current measurements for evaluating the source current flowing in said phase wire, the processor unit being arranged, for each phase wire, to detect faulty clamping between said phase wire and the input terminal connected to said phase wire on the basis of the voltage measurements and of the current measurements produced by the voltage sensor and by the associated current sensor.

There is also provided an electricity meter as described above, the source also having a neutral line and the electricity meter also including an input terminal arranged to be connected to the neutral line via a neutral wire, the processor unit being arranged:

when it detects faulty clamping between one or two phase wires and the corresponding input terminal(s) connected to said phase wire(s), to determine that the faulty clamping is in reality located at said input terminal(s);

when it detects simultaneous faulty clamping between all three phase wires and the three corresponding input terminals connected to said phase wires, to determine that the faulty clamping is in reality located at the input terminal connected to the neutral wire.

There is also provided an electricity meter as described above, the source having one phase line and one neutral line, the electricity meter being a single-phase meter including an input terminal arranged to be connected to the phase line by a phase wire and an input terminal arranged to be connected to neutral line by a neutral wire, the electricity meter including a voltage sensor arranged to produce voltage measurements for evaluating the source voltage present on said neutral wire, and a current sensor arranged to produce current measurements for evaluating the source current flowing in said phase wire, the processor unit being arranged to detect faulty clamping from the voltage measurements produced by the voltage sensor and from the current measurements produced by the current sensor.

There is also provided an electricity meter as described above, the source being a network for distributing electrical energy.

There is also provided an electricity meter as described above, the source being a subscriber installation that produces electrical energy.

There is also provided a detection method performed in a processor unit of an electricity meter as described above and comprising the steps of:

acquiring the voltage measurements and the current measurements, and detecting at least one predefined sequence comprising a first period during which the source current is less than a first predefined current threshold, and a second period during which the source current is greater than a second predefined current threshold that is itself greater than the first predefined current threshold;

for each predefined sequence, acquiring at least one first voltage measurement during the first period and at least one second voltage measurement during the second period;

detecting faulty clamping between at least one wire and the input terminal that is connected to said wire when, during at least one predefined sequence, at least one detection value representative of a difference between a first voltage measurement and a second voltage measurement is greater than or equal to a voltage threshold.

There is also provided a computer program including instructions that cause the processor unit of the electricity meter as described above to execute the steps of the detection method as described above.

There is also provided a computer-readable storage medium, storing the above-described computer program.

The invention can be better understood in the light of the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
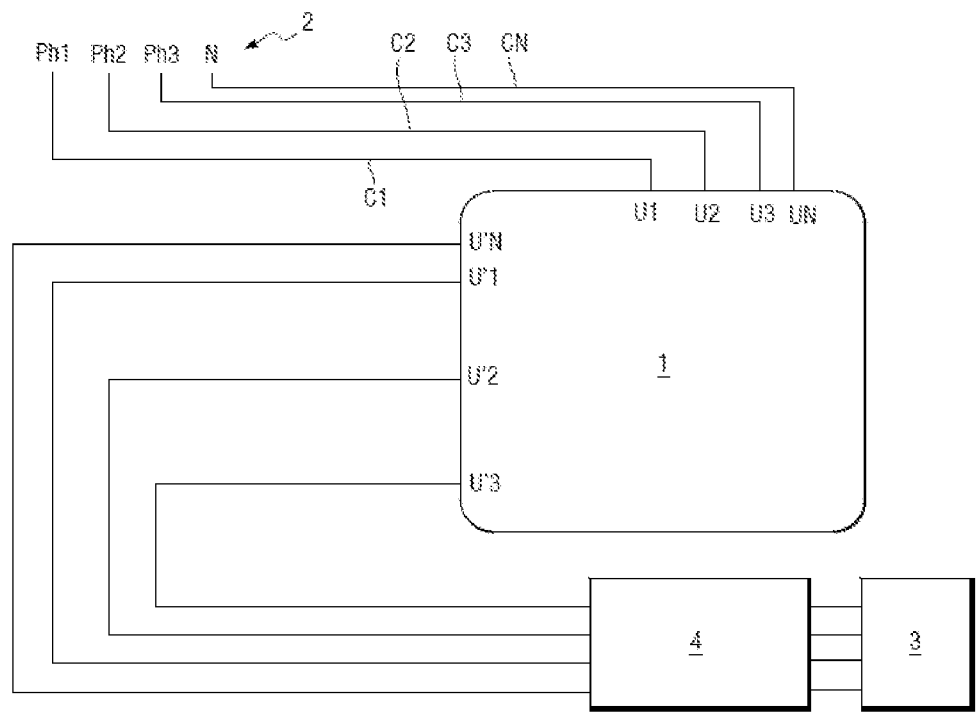
FIG. 1 shows an electricity meter in a first embodiment of the invention, the electricity meter being a three-phase meter in a four-wire configuration.

With reference to FIG. 1, an electricity meter 1 in a first embodiment of the invention is a three-phase meter that is arranged in a directly-connected four-wire configuration in a standard situation, which may be residential or industrial.

The electricity meter 1 is for measuring electrical energy delivered to a subscriber's electrical installation 3 by a source, and specifically by a distribution network 2.

The distribution network 2 has three phase lines Ph1, Ph2, and Ph3, together with one neutral line N. The meter 1 is connected to the phase and the neutral lines of the network 2 in order to perform measurements thereon.

A circuit breaker 4 is located at the boundary between the distribution network 2 and the installation 3. The circuit breaker 4 (which can be operated by the subscriber) serves in particular to protect the installation 3 by opening in the event of a surge current occurring in the distribution network 2, e.g. as a result of a short-circuit downstream from the circuit breaker 4. In this example, the term "downstream" means on the side of the installation 3 and the term "upstream" means on the side of the distribution network 2.

The meter 1 has three input terminals U1, U2, and U3, each connected to a respective one of the phase lines Ph1, Ph2, and Ph3 of the network 2 by means of a phase wire C1, C2, and C3, together with an input terminal UN that is connected to the neutral line N by a neutral wire CN.

The meter 1 also has four output terminals U'1, U'2, U'3, and U'N connected to the circuit breaker 4, which is itself connected to the installation 3.

Figure 2:
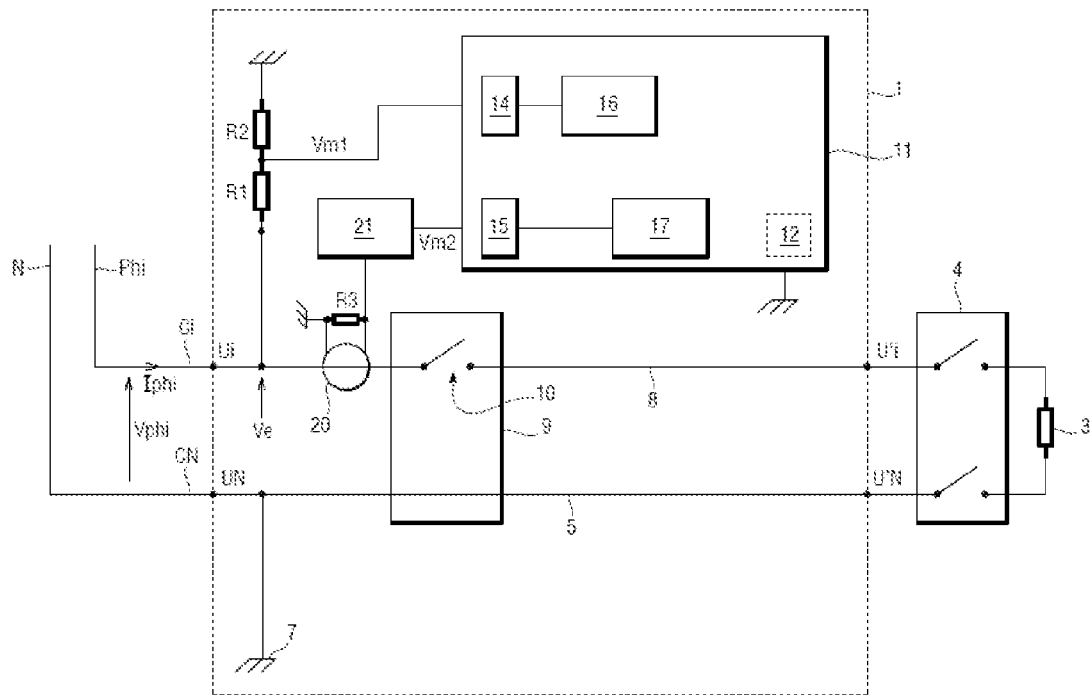
FIG. 2 is an electrical circuit diagram of the FIG. 1 meter (only one phase being shown)

With reference to FIG. 2, the meter 1 has a neutral conductor 5 connected to the input terminal UN. The neutral conductor 5 is connected to electrical ground 7 of the meter 1.

For each phase line Phi (for i lying in the range 1 to 3), the meter 1 has a respective phase conductor 8 connected to the corresponding input terminal Ui.

The meter 1 also includes a cut-off member 9 comprising, for each phase conductor 8, a respective distinct switch 10 connected in said phase conductor 8. The cut-off member 9 is used in particular for remotely interrupting or re-establishing the supply of power to the installation 3 (represented as a load), e.g. in the event of the subscription being cancelled or of the subscription contract not being complied with.

The meter 1 also has an application portion and a measurement portion.

The application portion includes an application microcontroller (not shown).

The measurement portion includes a metrological microcontroller 11, having the primary function of producing measurements of a certain number of parameters that enable the electricity consumption of the installation 3 to be evaluated.

The microcontroller 11 is also adapted to execute instructions of a program for performing the detection method described below. The instructions of the program are stored in a memory 12 that is incorporated in or connected to the microcontroller 11.

The microcontroller 11 incorporates a first analog-to-digital converter (ADC) 14, a second ADC 15, a voltage measurement module 16, and a current measurement module 17.

For each phase line Phi, the measurement portion includes a voltage sensor arranged to produce voltage measurements for evaluating the source voltage Vphi present on the phase wire Ci.

In this example, a voltage sensor includes a voltage divider bridge comprising a first measurement resistor R1 and a second measurement resistor R2. The first measurement resistor R1 has a first terminal connected to the phase conductor 8 in the proximity of the input terminal Ui (and downstream therefrom). The second measurement resistor R2 has a first terminal connected to electrical ground 7. The second terminals of the first and second measurement resistors R1 and R2 are connected together and to an input of the microcontroller 11 that is also connected to an input of the first ADC 14. The first ADC 14 thus has (at least) three inputs, i.e. one input per phase line Phi.

The voltage Vm1, as measured by the first ADC 14, is a voltage that is the image of the input voltage Ve (i.e. the voltage at the input terminal Ui and downstream therefrom) and it enables the source voltage Vphi to be evaluated.

The level of the voltage Vm1 is adapted (by means of the divider bridge R1, R2) so as to avoid saturating the first ADC 14, and so as to apply signals to the input of the first ADC 14 that are at levels that are meaningful (corresponding to the input range of the first ADC 14).

The first ADC 14 thus digitizes the voltage Vm1. On the basis of the samples produced by the first ADC 14, the voltage measurement module 16 produces measurements of the root mean square (RMS) voltage serving to evaluate the input voltage Ve. The microcontroller 15 uses the voltage measurements to evaluate the source voltage Vphi supplied by the network 2 even though the input voltage Ve is not exactly equal to the source voltage Vphi, as explained below.

For each phase line Phi, the measurement portion also includes a respective current sensor arranged to produce current measurements that are representative of the source current Iphi flowing in the phase conductor Ci.

The current sensor includes a torus 20 mounted on the phase conductor 8 upstream from the switch 10 of the cut-off member 9. A third measurement resistor R3 is connected across the output terminals of the torus 20.

The measurement components also include a current measurement circuit 21 presenting known gain. The current measurement circuit 21 is connected to one of the terminals of the third measurement resistor R3, with the other terminal of the measurement resistor being connected to ground 7.

The output of the current measurement circuit 21 is connected to an input of the microcontroller 11 that has a second ADC 15 connected thereto. The second ADC 15 thus has (at least) three inputs, i.e. one input per phase line Phi.

The voltage Vm2 at the output from the current measurement circuit 21 is an image of the source current Iphi.

The level of the voltage Vm2 is adapted (by means of the gain of the current measurement circuit 21) so as to avoid saturating the second ADC 15, and so as to apply signals to the input of the second ADC 15 that are at levels that are meaningful (corresponding to the input range of the second ADC 15).

The second ADC 15 digitizes the voltage Vm2. From the samples produced by the second ADC 15, the current measurement module 17 produces measurements that make it possible to evaluate the source current Iphi.

In this example, the voltage measurement module 16 and the current measurement module 17 both produce measurements for each phase line once every second.

There follows a more precise description of the way in which the meter 1 detects faulty clamping between a phase wire Ci and the associated input terminal Ui. The following explanation is valid for each of the phases Ph1, Ph2, and Ph3.

When the phase wire Ci is properly clamped to the input terminal Ui, the input terminal Ui typically presents impedance with a magnitude of about 1 milliohm (mΩ). When the phase wire Ci is poorly clamped or lose, the input terminal Ui typically presents impedance with a magnitude of about 10 mΩ.

For a given source voltage Vphi (as supplied by the network 2 upstream from the input terminal Ui), when the source current Iphi goes from a low value to a high value, the input voltage Ve as measured by the meter 1 (downstream from the input terminal Ui) thus varies in different manner depending on whether the phase wire Ci is or is not properly clamped.

When the phase wire Ci is properly clamped, the voltage variation is low, whereas when the phase wire is poorly clamped, the voltage variation is high.

Thus, for a source voltage of 230 V RMS, when the phase wire Ci is properly clamped to the input terminal Ui, the input voltage Ve drops by about 0.04 V RMS whereas, when the phase wire Ci is poorly clamped to the input terminal Ui, the voltage drops by an amount greater than or equal to 0.4 V RMS.

The microcontroller 11 thus acquires the current measurements and the voltage measurements, and it attempts to detect a predefined sequence comprising a first period during which the source current Iphi is less than a first predefined current threshold, and a second period during which the source current Iphi is greater than a second predefined current threshold that is itself greater than the first predefined threshold.

The first predefined current threshold SI1 typically lies in the range 2.5 A to 7.5 A, and in this example is equal to 5 A. The first predefined current threshold SI1 is programmable.

The second predefined current threshold SI2 typically lies in the range 20 A to 60 A, and in this example is equal to 40 A. The second predefined current threshold SI2 is programmable.

For each predefined sequence, the microcontroller 11 acquires at least one first voltage measurement during the first period and at least one second voltage measurement during the second period.

The microcontroller 11 detects faulty clamping between the phase wire Ci and the input terminal Ui when, during at least one predefined sequence, at least one detection value representative of a difference between a first voltage measurement and a second voltage measurement is greater than or equal to a voltage threshold. In this example, the detection value is equal to this difference.

The voltage threshold SV typically lies in the range 0.2 V RMS to 0.6 V RMS, and in this example is equal to 0.4 V RMS. The voltage threshold SV is programmable.

It should be observed that RMS voltages are conventionally measured in a meter to within 0.1% or better (which corresponds to 0.2 V RMS at 230 V).

In this example, the microcontroller 11 confirms detection of faulty clamping over a plurality of measurements.

The microcontroller 11 acts over a single predefined sequence to obtain a plurality of detection values, and detects faulty clamping when the number of those detection values that are greater than the voltage threshold reaches a first predefined number.

In this example, the first predefined number is equal to three.

More precisely, the microcontroller 11 acquires (at least) one first voltage measurement during the first period, and then acquires (at least) three second voltage measurements during the second period. The microcontroller 11 calculates (at least) three detection values, each of which is equal to the difference between a respective one of the second voltage measurements and the first voltage measurement, and it detects faulty clamping at the input terminal Ui when at least three detection values are greater than the voltage threshold. Detection of faulty clamping is thus confirmed over three consecutive seconds.

Alternatively, the microcontroller 11 could act over a plurality of successive predefined sequences to obtain detection values, the number of successive sequences being a second predefined number, and to detect faulty clamping when a plurality of those detection values are greater than the voltage threshold.

In this example, the second predefined number is equal to three. Detection of faulty clamping is thus confirmed over three successive predefined sequences.

It should be observed that the microcontroller 11 detects a predefined sequence when the duration between the first period and the second period is less than a predefined time threshold.

Specifically, for the criteria to be applicable, the lapse of time between the end of a low current period (first period) and the beginning of a high current period (second period) must be less than a predefined time threshold so that it can be assumed that the source voltage upstream from the meter 1 does not vary significantly between the low current period and the high current period.

The predefined time threshold T typically lies in the range 30 seconds (s) to 90 s, and in this example it is equal to 60 s. The predefined time threshold T is programmable.

As mentioned above, the voltage threshold SV is programmable, and by way of example it is equal to 0.4 V RMS, i.e. to a value that is constant.

Alternatively, the voltage threshold SV may depend on the first current measurement (taken during the first period) and on the second current measurement (taken during the second period).

For example:

$$SV=a*(I2-I1);$$

where SV is the voltage threshold, a is a parameter, I1 is the first current measurement taken during the first period, and I2 is the second current measurement taken during the second period. Naturally, if a plurality of measurements are taken during each period, then I1 and I2 are obtained from said measurements (e.g. by averaging). Advantageously, each of the first and second current measurements is obtained from at least two successive measurements that are stable (the current is stable over at least two seconds).

The parameter a is programmable.

The parameter a may be defined as a function of the first predefined current threshold and of the second predefined current threshold.

In this example, the following applies:

$$a = 0.4/(IS2 - IS1) = 0.4/(40 - 5) = 0.01142857.$$

It should also be observed that detection of faulty clamping is considered to be valid if, and only if, there is no anomaly concerning the source voltage Vphi while the measurements are being taken (no voltage sag, no power cut, even if short, no surge).

When the microcontroller 11 detects faulty clamping to the input terminal Ui, the microcontroller 11 displays an alarm message on the liquid crystal display (LCD) screen of the meter 1 to be seen by the installer.

The alarm message is also sent to the information system (IS) of the network manager.

In order to send alarm messages, the microcontroller 11 co-operates with communication means incorporated in the meter 1. By way of example, the communication means 1 make use of powerline communication (PLC), e.g. using the PLC-G3 standard, or radio communication over a cellular network (e.g. using the LTE-M protocol or the NB-IoT protocol), or any other technology enabling remote communication to be set up.

When the microcontroller 11 detects clamping faults between one or two phase wires Ci and the associated input terminals Ui, the microcontroller 11 determines that the faulty clamping is in reality located at each of said input terminals Ui.

In contrast, when the microcontroller 11 detects clamping faults simultaneously between all three phase wires Ci and the three input terminals Ui, the microcontroller 11 corrects its location of anomalies and determines that the faulty clamping is in reality located between the input terminal UN connected to the neutral wire CN (i.e. not at the input terminals Ui connected to the phase wires Ci).

Thus, the alarm message contains both an indication to the effect that faulty clamping has been detected in at least one location, and an indication locating the faulty clamping at one or more particular input terminals.

Advantageously, the faulty clamping detection function can be "de-clutched", i.e. it can be deactivated (and re-activated) either locally, e.g. by the installer (using a button provided for this purpose on the meter 1, or using any other type of human-machine interface), or else remotely, e.g. on instruction from the network manager (and for example using the above-mentioned communication means).

Figure 3:
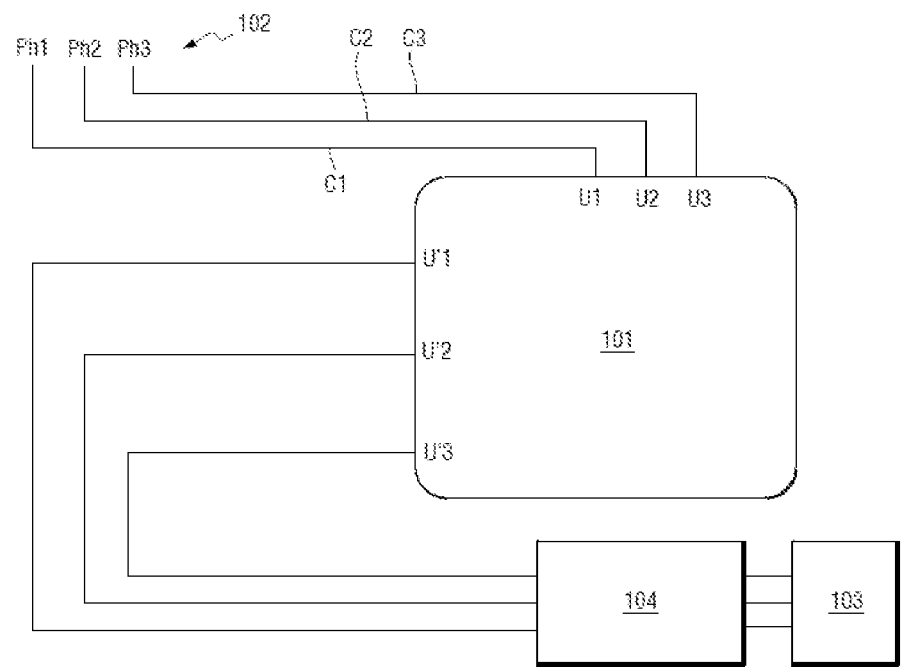
FIG. 3 shows an electricity meter in a second embodiment of the invention, the electricity meter being a three-phase meter in a three-wire configuration.

In FIG. 3, there can be seen an electricity meter 101 in a second embodiment of the invention. The meter 101 is a three-phase meter, arranged in a three-wire configuration.

The distribution network 102 has three phase lines Ph1, Ph2, and Ph3.

A circuit breaker 104 is located at the boundary between the distribution network 102 and the subscriber installation 103.

The meter has both three input terminals U1, U2, and U3, each connected to a respective one of the phase lines via a cable having three phase wires C1, C2, and C3, and also three output terminals U'1, U'2, and U'3 connected to the circuit breaker 104.

The circuit diagram of FIG. 2 is applicable to each of the phases of the meter 101.

Figure 4:
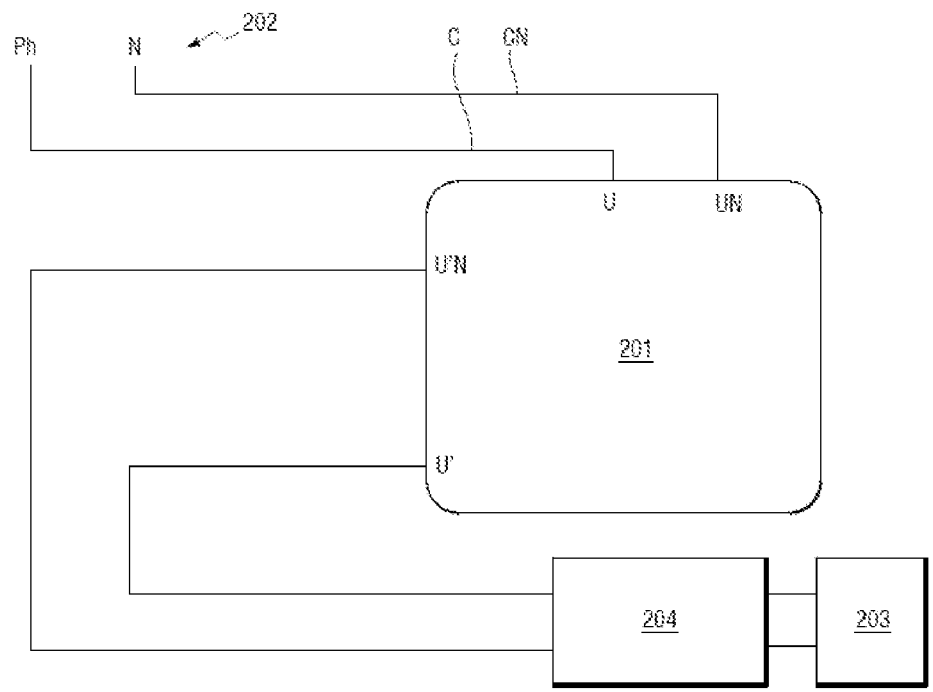
FIG. 4 shows an electricity meter in a third embodiment of the invention, the electricity meter being a single-phase meter.

In FIG. 4, there can be seen an electricity meter 201 in a third embodiment of the invention. The meter 201 is a single-phase meter.

The distribution network 202 has one phase line Ph and one neutral line N. The meter 201 has both two input terminals U and UN, one connected to the phase line Ph and the other to the neutral line N, and also two output terminals U' and U'N.

A circuit breaker 204 is located at the boundary between the distribution network 202 and the subscriber installation 203.

Figure 5:
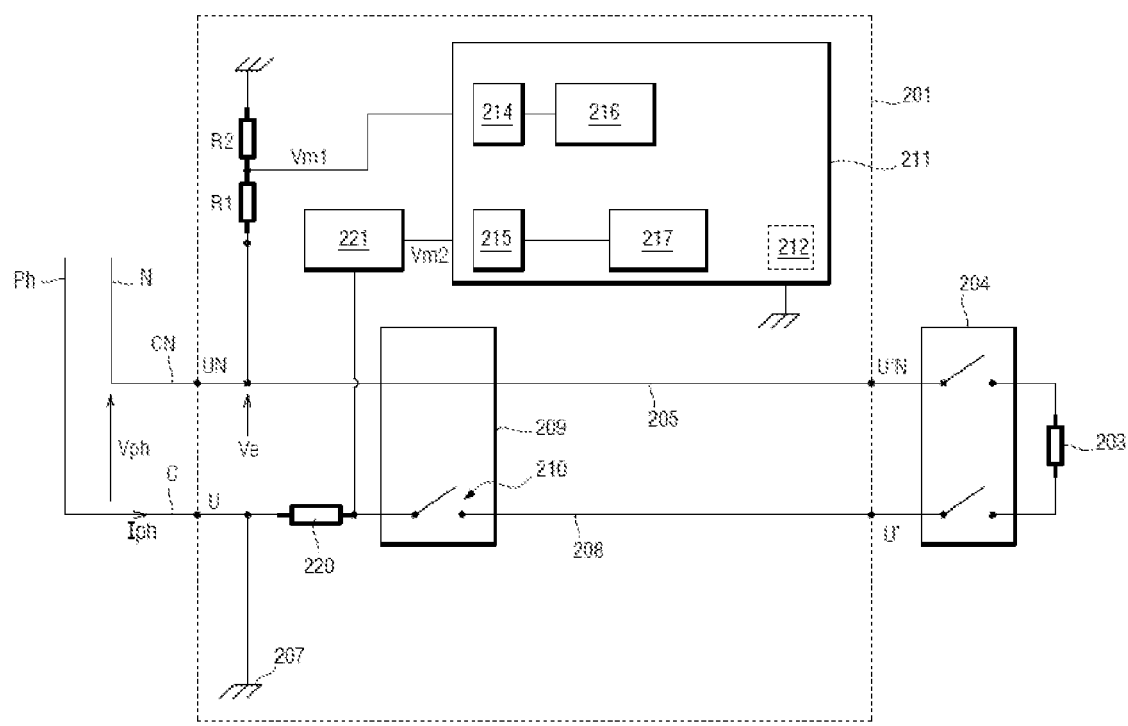
FIG. 5 is an electrical circuit diagram of the FIG. 4 meter.

With reference to FIG. 5, the electrical circuit diagram of the meter 201 is similar to that of FIG. 2.

Most of the elements present in FIG. 2 can thus be seen again, and their references in FIG. 5 are increased by 200.

Nevertheless, in this example, the phase conductor 208 is connected to electrical ground 207. The input voltage Ve is measured on the neutral conductor 205, i.e. the first measurement resistor R1 has a first terminal connected to the neutral conductor 205. In this example, the current sensor is a shunt 220 connected in the phase conductor 208, having a first terminal connected to the input terminal U and a second terminal connected to the cut-off member 209.

The microcontroller 211 detects faulty clamping from voltage measurements produced by the voltage sensor and from current measurements produced by the current sensor.

When the microcontroller 211 detects faulty clamping, it locates the faulty clamping on all of the input terminals (i.e. the faulty clamping might be at the input terminal P, the input terminal N, or at both input terminals).

Naturally, the invention is not limited to the embodiments described, but covers any variant coming within the ambit of the invention as defined by the claims.

In each detected predefined sequence, the first period (low current) may precede the second period (high current), but that is not essential.

The predefined sequences may be sequences in which the first period precedes the second period, or else sequences in which the second period precedes the first period, or indeed sequences having a first period and a second period regardless of the order in which the periods arrive.

If the first period precedes the second period, the microcontroller detects an abnormal drop in the input voltage in the event of faulty clamping; if the second period precedes the first period, then the microcontroller detects an abnormal rise in the input voltage in the event of faulty clamping.

The source that supplies the electrical energy measured by the meter need not necessarily be the distribution network upstream from the meter.

The source could also be a subscriber installation downstream from the meter. The installation would then no longer be a "consumer" but rather a "producer", and it would supply energy to the network.

The invention is then implemented in the same manner, except that the input terminals are now the terminals U'1, U'2, U'3, and possibly U'N for a three-phase meter, or else U' and U'N for a single-phase meter.

For a single-phase meter, the faulty clamping is located either at the input terminal U', or else at the input terminal U'N, or else at both input terminals.

For a three-phase meter with neutral, the faulty clamping is located on one or two of the input terminals U'i (i lying in the range 1 to 3) when one or two of the phases are faulty, and when all three phases are faulty, the faulty clamping is located at the input terminal U'N.

For a "producer" installation, it is assumed that the impedance resulting from the cut-off member is negligible (being of the order of a few hundreds of micro-ohms ($\Omega\Omega$), and not more than 500 μΩ).

The architecture of the meter could naturally be different from that described above.

Two ADCs are described as being incorporated in the microcontroller. Nevertheless, it is possible to make use of a single ADC incorporated in the microcontroller. The one or more ADCs may also be external to the microcontroller.

The microcontroller that performs the detection method need not necessarily be the measurement microcontroller, but could be a distinct component, for example it could be the application microcontroller of the application portion.

More generally, the detection method may be performed in a processor unit comprising at least one processor component and memory. The processor component need not necessarily be a microcontroller, but it could be a different component, e.g. a conventional processor, a digital signal processor (DSP), or indeed a programmable logic circuit such as a field programmable gate array (FPGA) or an application specific integrated circuit (ASIC).

The invention claimed is:

1. An electricity meter, arranged to measure electrical energy supplied by a source, the electricity meter comprising:
    at least one input terminal, each input terminal being arranged to be connected to the source by a respective wire;
    at least one voltage sensor and at least one current sensor arranged to act from inside the electricity meter to take voltage measurements to evaluate a source voltage supplied by the source, and current measurements for evaluating a source current supplied by the source; and
    a processor unit arranged:
        to acquire the voltage measurements and the current measurements, and to detect at least one predefined sequence comprising a first period during which the source current is less than a first predefined current threshold, and a second period during which the source current is greater than a second predefined current threshold that is itself greater than the first predefined current threshold;
        for each predefined sequence, to acquire at least one first voltage measurement during the first period and at least one second voltage measurement during the second period;
        to detect faulty clamping between at least one wire and the input terminal that is connected to said wire when, during at least one predefined sequence, at least one detection value representative of a difference between a first voltage measurement and a second voltage measurement is greater than or equal to a voltage threshold.

2. The electricity meter according to claim 1, wherein the processor unit is arranged to detect a predefined sequence only when the duration between the first period and the second period is less than a predefined time threshold.

3. The electricity meter according to claim 1, wherein the voltage threshold is defined as a function both of a first current measurement taken during the first period and also of a second current measurement taken during the second period.

4. The electricity meter according to claim 3, wherein the following applies:

$$SV=a*(I2-I1);$$

where SV is the voltage threshold, a is a parameter, I1 is the first current measurement taken during the first period, and I2 is the second current measurement taken during the second period.

5. The electricity meter according to claim 4, wherein the parameter a is defined as a function both of the first predefined current threshold and also of the second predefined current threshold.

6. The electricity meter according to claim 1, wherein the processor unit is arranged to act over a single predefined sequence to obtain a plurality of detection values, and to detect faulty clamping when the number of those detection values that are greater than the voltage threshold reaches a first predefined number.

7. The electricity meter according to claim 1, wherein the processor unit is arranged to act over a plurality of successive predefined sequences to obtain detection values, the number of successive sequences being a second predefined number, and to detect faulty clamping when a plurality of those detection values are greater than the voltage threshold.

8. The electricity meter according to claim 1, wherein the first predefined current threshold lies in the range 2.5 A to 7.5 A, and the second predefined current threshold lies in the range 20 A to 60 A.

9. The electricity meter according to claim 1, the source comprising three phase lines, the electricity meter being a three-phase meter including three input terminals, each arranged to be connected to a respective phase line via a respective phase wire, the electricity meter including, for each phase wire, both a respective voltage sensor arranged to produce voltage measurements for evaluating the source voltage present on said phase wire and also a current sensor arranged to produce current measurements for evaluating the source current flowing in said phase wire, the processor unit being arranged, for each phase wire, to detect faulty clamping between said phase wire and the input terminal connected to said phase wire on the basis of the voltage measurements and of the current measurements produced by the voltage sensor and by the associated current sensor.

10. The electricity meter according to claim 9, the source also comprising a neutral line and the electricity meter also including an input terminal arranged to be connected to the neutral line via a neutral wire, the processor unit being arranged:

when it detects faulty clamping between one or two phase wires and the corresponding input terminal(s) connected to said phase wire(s), to determine that the faulty clamping is in reality located at said input terminal(s);

when it detects simultaneous faulty clamping between all three phase wires and the three corresponding input terminals connected to said phase wires, to determine that the faulty clamping is in reality located at the input terminal connected to the neutral wire.

11. The electricity meter according to claim 1, the source comprising one phase line and one neutral line, the electricity meter being a single-phase meter including an input terminal arranged to be connected to the phase line by a phase wire and an input terminal arranged to be connected to neutral line by a neutral wire, the electricity meter including a voltage sensor arranged to produce voltage measurements for evaluating the source voltage present on said neutral wire, and a current sensor arranged to produce current measurements for evaluating the source current flowing in said phase wire, the processor unit being arranged to detect faulty clamping from the voltage measurements produced by the voltage sensor and from the current measurements produced by the current sensor.

12. The electricity meter according to claim 1, the source being a network for distributing electrical energy.

13. The electricity meter according to claim 1, the source being a subscriber installation that produces electrical energy.

14. A detection method performed by a processor unit of an electricity meter according to any preceding claim, and comprising the steps of:

acquiring the voltage measurements and the current measurements, and detecting at least one predefined sequence comprising a first period during which the source current is less than a first predefined current threshold, and a second period during which the source current is greater than a second predefined current threshold that is itself greater than the first predefined threshold;

for each predefined sequence, acquiring at least one first voltage measurement during the first period and at least one second voltage measurement during the second period;

detecting faulty clamping between at least one wire and the input terminal that is connected to said wire when, during at least one predefined sequence, at least one detection value representative of a difference between a first voltage measurement and a second voltage measurement is greater than or equal to a voltage threshold.

15. A nontransitory computer-readable storage medium storing a computer program including instructions that cause the processor unit of the electricity meter to execute the method according to claim 14.

* * * * *